United States Patent
Lee et al.

(10) Patent No.: US 6,440,318 B1
(45) Date of Patent: Aug. 27, 2002

(54) PRINTED CIRCUIT BOARD WITH A MULTILAYER INTEGRAL THIN-FILM METAL RESISTOR AND METHOD THEREFOR

(75) Inventors: Tien Lee, Ithaca, NY (US); Lawrence Lach, Chicago; Gregory J. Dunn, Arlington Heights, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/507,579

(22) Filed: Feb. 18, 2000

Related U.S. Application Data

(62) Division of application No. 09/268,956, filed on Mar. 16, 1999, now Pat. No. 6,194,990.

(51) Int. Cl.[7] ............... H01B 13/00; H01K 3/10; H01C 1/02
(52) U.S. Cl. ............... 216/13; 216/41; 29/610.1; 174/260
(58) Field of Search ............... 216/13, 41; 29/610.1; 174/260

(56) References Cited

U.S. PATENT DOCUMENTS

| | | | |
|---|---|---|---|
| 2,945,180 A | 7/1960 | Parker | 324/126 |
| 3,808,576 A | 4/1974 | Castonguay et al. | 338/309 |
| 3,813,631 A | 5/1974 | Matsuda et al. | 338/320 |
| 4,174,513 A | 11/1979 | Wellard | 338/312 |
| 4,737,747 A * | 4/1988 | Henderson et al. | 29/610.1 |
| 4,888,574 A | 12/1989 | Rice | 338/309 |
| 4,892,776 A | 1/1990 | Rice | 428/209 |
| 5,336,391 A | 8/1994 | Rice | 205/152 |
| 5,422,313 A | 6/1995 | West | 437/217 |
| 5,483,217 A | 1/1996 | Nagasaka et al. | 338/252 |
| 5,756,971 A | 5/1998 | Hipp | 219/537 |
| 5,864,281 A | 1/1999 | Zhang et al. | 338/22 R |
| 5,907,273 A | 5/1999 | Ross, Jr. et al. | 338/176 |
| 5,994,997 A * | 11/1999 | Brown et al. | 338/204 |
| 6,141,870 A * | 11/2000 | McDermott et al. | 29/825 |
| 6,232,042 B1 * | 5/2001 | Dunn et al. | 427/126.6 |
| 6,248,612 B1 * | 6/2001 | Castro et al. | 438/106 |

OTHER PUBLICATIONS

Caddock Electronics 1973 General Catalog.

* cited by examiner

*Primary Examiner*—Randy Gulakowski
*Assistant Examiner*—Shamim Ahmed
(74) *Attorney, Agent, or Firm*—Daniel K. Nichols

(57) ABSTRACT

A thin-film metal resistor (44) suitable for a multilayer printed circuit board (12), and a method for its fabrication. The resistor (44) generally has a multilayer construction, with the individual layers (34, 38) of the resistor (44) being self-aligned with each other so that a negative mutual inductance is produced that very nearly cancels out the self-inductance of each resistor layer (34, 38). As a result, the resistor (44) has a very low net parasitic inductance. In addition, the multilayer construction of the resistor (44) reduces the area of the circuit board (12) required to accommodate the resistor (44), and as a result reduces the problem of parasitic interactions with other circuit elements on other layers of the circuit board (12).

5 Claims, 4 Drawing Sheets

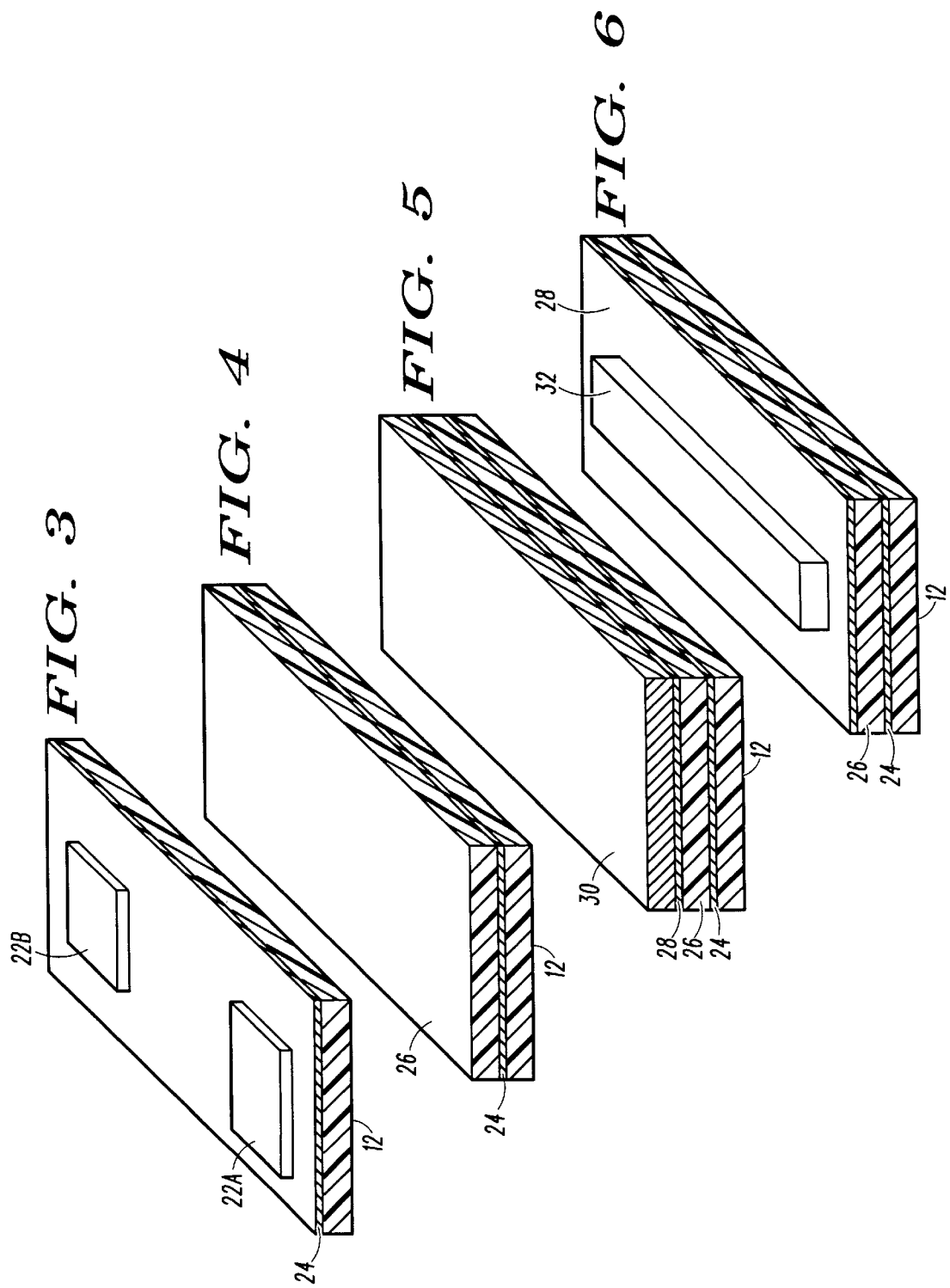

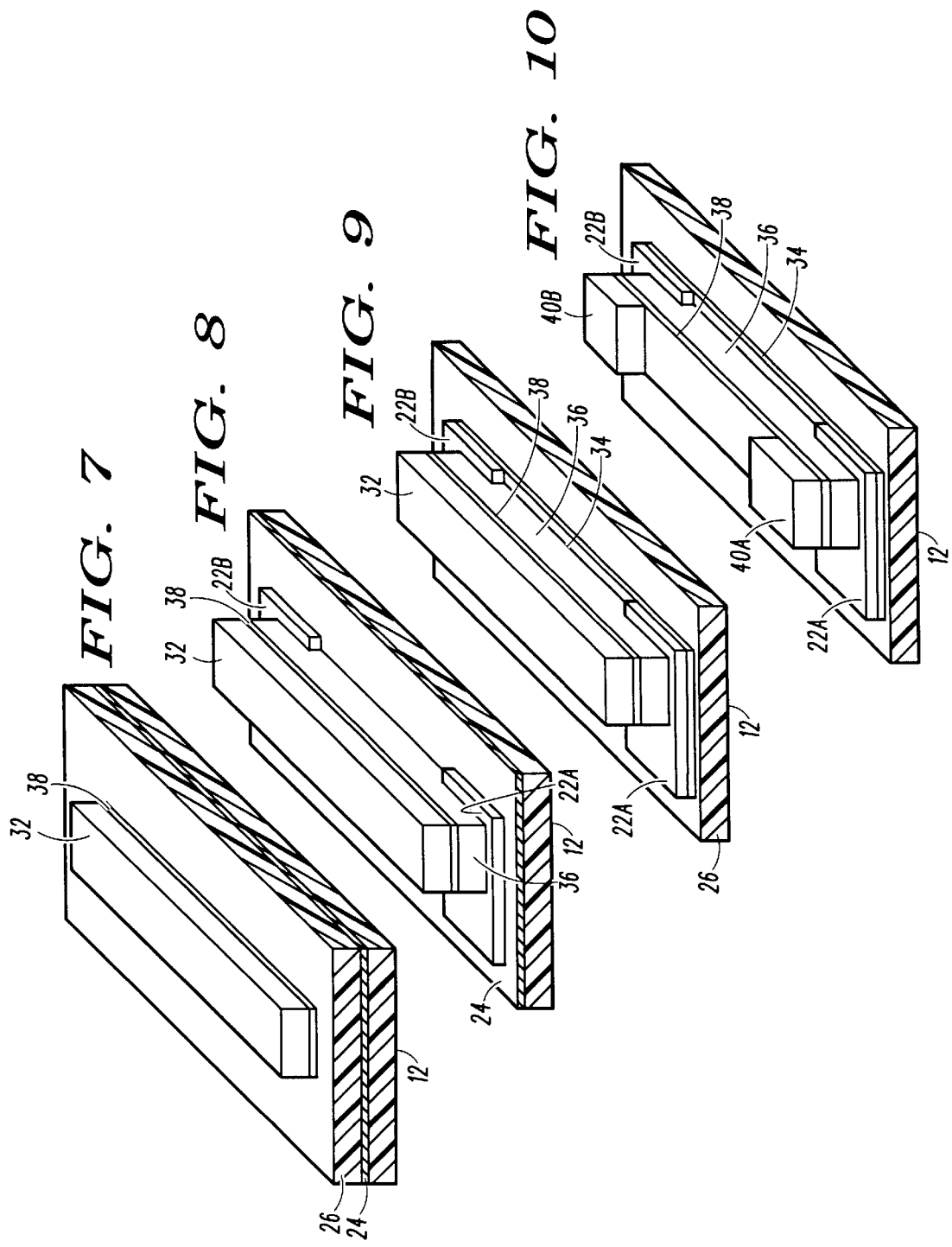

PRINTED CIRCUIT BOARD WITH A MULTILAYER INTEGRAL THIN-FILM METAL RESISTOR AND METHOD THEREFOR

The present application is a division of U.S. application Ser. No. 09/268,956, filed on Mar. 16, 1999, which is hereby incorporated by reference, and priority thereto for common subject matter is hereby claimed, now U.S. Pat. No. 6,194,990.

This invention was made with Government support under Agreement No. F33615-96-2-1838 awarded by DARPA. The Government has certain rights in the invention.

BACKGROUND OF THE INVENTION

1. Field of the Invention

The present invention generally relates to electrical circuits and their fabrication. More particularly, this invention relates to a process for forming thin-film metal resistors that can have high resistance without increasing parasitic series inductance, and are therefore highly desirable for use in multilayer high-density electronic circuits.

2. Description of the Prior Art

Thin-film resistors formed of such metal-based materials as nickel-phosphorus, nickel-chromium, chromium silicide and tantalum nitride have been employed in multilayer hybrid electronic circuits. Thin-film metal materials generally exhibit good resistor properties, such as stability and ease of processing, but are limited to low sheet resistance, typically on the order of 100 ohms/square or less. Many resistors in a typical electrical circuit have resistance values in the kilo-ohm range. While such resistors can be fabricated using a thin-film metal resistor material, the low sheet resistance of the material necessitates that the resistors be ten to one hundred squares in size, e.g., about five mils (127 micrometers) wide and about fifty to five hundred mils (1.27 to 12.7 millimeters) long. Resistors of this size pose several problems. First, they have high parasitic series inductance, which degrades the resistor's performance for high frequency applications. Secondly, they encumber an excessive amount of board area. By occupying so much board area in a multilayer high-density board construction, the resistors greatly aggravate the problem of unwanted z-axis interactions with circuit elements in overlying and underlying circuit layers.

As an alternative, screen-printed polymer thick-film (PTF) materials offer higher sheet resistances than thin-film resistive metals. However, PTF materials are less stable under environmental stress, and are not as compatible with large format printed circuit board fabrications. Accordingly, it would be desirable if a method were available for producing resistors for multilayer high-density printed circuit boards that had the property advantages of thin-film metal resistor materials, but avoided the disadvantages associated with the use of such materials when used to form resistors having resistance values of 1000 ohms or more.

SUMMARY OF THE INVENTION

According to the present invention, there is provided a thin-film metal resistor suitable for a multilayer printed circuit board, and a method for its fabrication. The resistor of this invention generally has a multilayer construction, with the individual layers of the resistor being self-aligned with each other so that a negative mutual inductance is produced that very nearly cancels out the self-inductance of each resistor layer. As a result, the resistor has a very low net parasitic inductance. In addition, the multilayer construction of the resistor reduces the area of the circuit board required to accommodate the resistor, and as a result reduces the problem of parasitic interactions with other circuit elements on other layers of the circuit board.

The method of this invention generally entails forming a first resistive film on a substrate, forming a dielectric layer that overlies the first resistive film, forming a second resistive film on the dielectric layer so that the first resistive film is superimposed by the second resistive film—more particularly, the first and second resistive films are aligned with each other, so that their perimeters superimpose each other. This aspect of the invention is promoted by forming the first and second resistive films to be self-aligned by using a single mask to define their shapes. Adjacent portions of the first and second resistive films are then electrically interconnected, so that a resistor path is defined that starts at a first portion of the first resistive film, follows the first resistive film to its electrically interconnected portion, continues to the adjacent portion of the second resistive film through the electrical interconnect therebetween, and then follows the second resistive film to a portion thereof adjacent the first portion of the first resistive film.

According to the above, the thin-film resistor produced by the method of this invention is characterized by at least two superimposed resistive films that are electrically interconnected so that the resistive path through the resistor loops back, producing a negative mutual inductance that very nearly cancels out the self-inductance of the individual resistive films.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing, in which:

FIGS. 3 through 10 are perspective views showing process steps for forming the thin-film metal resistor of FIG. 1.

DETAILED DESCRIPTION OF THE PREFERRED EMBODIMENT

Figure 1:
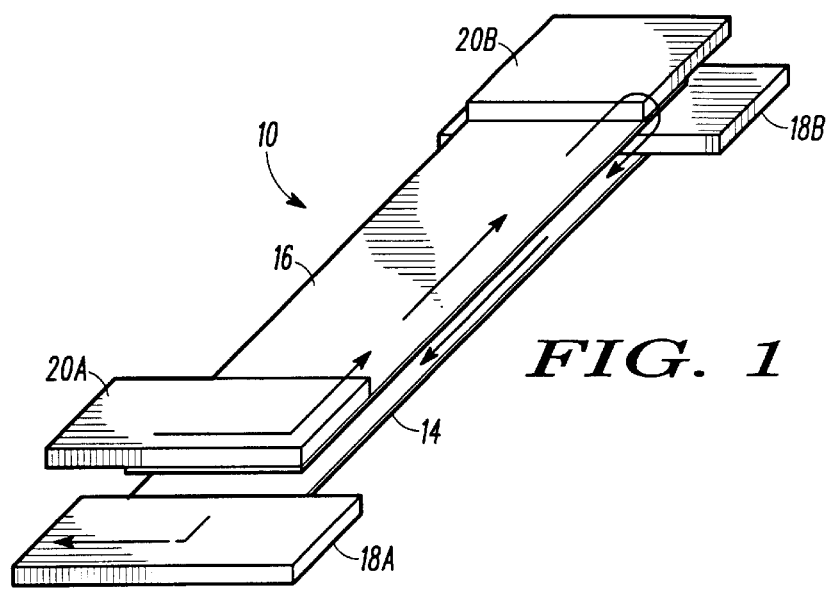
FIGS. 1 and 2 are perspective views of multilayer thin-film metal resistors in accordance with this invention.
Figure 2:
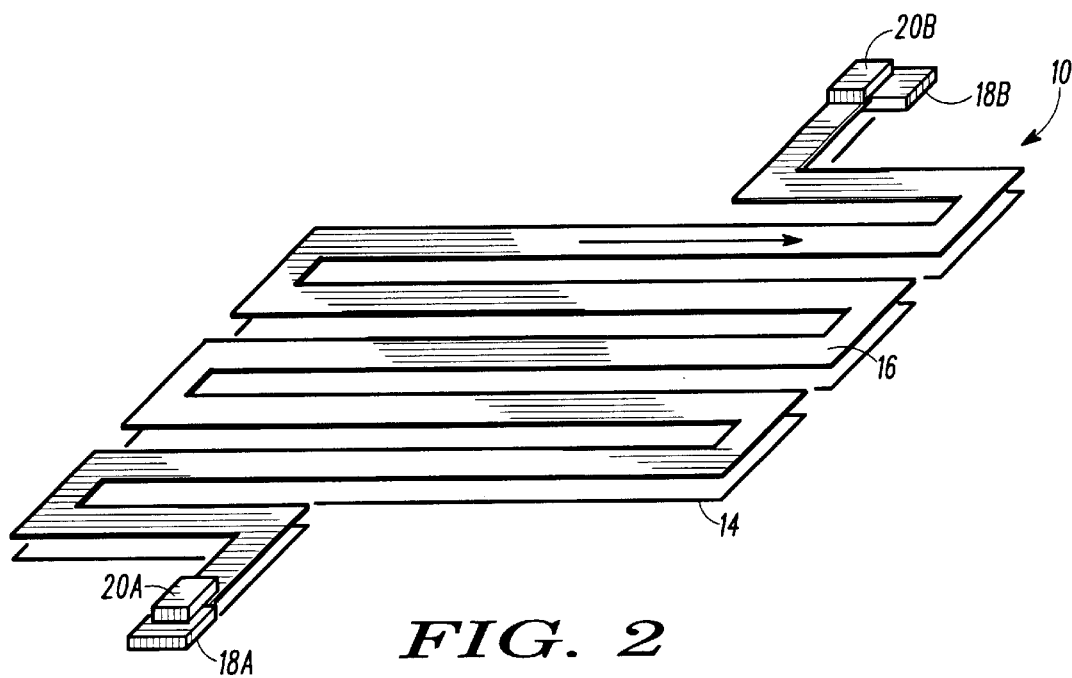

Two embodiments of multilayer thin-film metal resistors 10 are schematically represented in FIGS. 1 and 2 in accordance with this invention. The resistor 10 of FIG. 1 has a rectangular shape, while the resistor 10 of FIG. 2 has a serpentine shape. Though differing in appearance, both resistors 10 have a multilayer construction in accordance with this invention. From the following, those skilled in the art will appreciate that a variety of resistors shapes and termination configurations are possible, such that variations and modifications to the resistors 10 of FIG. 1 and 2 are within the scope of this invention.

As shown, each resistor 10 comprises a pair of resistive films 14 and 16, each film 14 and 16 being equipped with a pair of terminations 18A, 18B and 20A, 20B, respectively, that determine the electrical length through their respective films 14 and 16. The films 14 and 16 are separated and electrically insulated from each other by a dielectric layer (not shown), except for an electrical interconnect, such as a plated via (not shown) that electrically interconnects the terminations 18B and 20B. As a result, the electrical path through each resistor 10 is between the aligned pair of terminations 18A and 20A through the resistive films 14 and 16 and the electrical interconnect.

The films 14 and 16 are shown as being superimposed, so that their perimeters are aligned with each other. As will be described below with reference to FIGS. 3 through 11, accurate physical alignment of the resistive films 14 and 16 is achieved with this invention. While not intending to be limited to a particular theory, it is believed that if the distance between the films 14 and 16 is relatively small compared to the linewidth of the films 14 and 16, accurate superimposition of the films 14 and 16 causes the parasitic self-inductance generated by each film 14/16 to be very nearly canceled by a negative mutual inductance generated by the other film 14/16. For example, self-inductance has been shown to be very nearly canceled for resistive films having linewidths of about five mils (about 125 m) separated by a dielectric layer having a thickness of about one mil (about 25 m). Accurate alignment of the films 14 and 16 is a critical feature of the invention, since the magnitude of the negative mutual inductance has been shown to fall off very rapidly with misregistration of the films 14 and 16. According to a preferred aspect of this invention, the films 14 and 16 are self-aligned through a process that delineates the resistive films 14 and 16 with a single mask.

A preferred process for fabricating a multilayer resistor 44 is represented in FIGS. 3 through 11. While the resistor 44 is shown as having a rectangular shape similar to the resistor of FIG. 1, those skilled in the art will appreciate that the same process can be applied to resistors that differ considerably in appearance, including the resistor of FIG. 2. The resistor 44 (represented in its final form in FIG. 11) is fabricated on a substrate 12 of a printed circuit board, though other suitable board constructions and substrates could also be used, such as a flexible circuit or a ceramic or silicon substrate. A resistive layer 24 and terminations 22A and 22B are shown in FIG. 3 as having been previously formed on the substrate 12. In a preferred embodiment, the resistive layer 24 and terminations 22A and 22B are formed from a foil (not shown) laminated to the surface of the substrate 12. Such a foil includes the resistive layer 24 and a conductive layer that overlies the resistive layer 24 once laminated to the substrate 12. The resistive layer 24 is preferably a nickel-base alloy, more preferably a nickel-phosphorus or nickel-chromium alloy, which exhibits such desirable resistor properties as stability and ease of processing. A preferred resistive layer 24 is formed of a nickel-phosphorus alloy containing a maximum of fifty weight percent of phosphorus, with the balance nickel and incidental impurities. A preferred thickness for the resistive layer 24 is about 0.01 to about 1.0 micrometer, while a suitable thickness for the conductive layer (and therefore the terminations 22A and 22B) is about 5 to about 40 micrometers. Because the terminations 22A and 22B are formed from the conductive layer, a preferred material for the conductive layer is copper, though it is foreseeable that other materials could be used. A laminate Cu/NiP foil that meets the above requirements is commercially available from Ohmega Technologies under the name Ohmegaply.

Once the foil is laminated to the substrate 12, the conductive layer is etched to yield the terminations 22A and 22B, with the resistive layer 24 remaining adhered to the surface of the substrate 12. If formed of copper, the conductive layer can be etched by such known etchants as conventional alkaline ammoniacal etchants, which are not aggressive toward the resistive layer 24. A suitable masking material for this step is a conventional dry film photoresist. As will be understood from the following description, this first etch delineates the length of the first resistive film 34. After etching, a dielectric layer 26 is applied that covers the resistive layer 24 and the terminations 22A and 22B, as shown in FIG. 4. The dielectric layer 26 is formed of a positive photoimagable thick-film polymer, such that known photoimaging and development techniques can be employed to pattern the dielectric layer 26. Suitable thick-film polymer compositions typically include a resin, photosensitive agents and hardeners. The resin component can be any suitable liquid resin or solid resin, so as to enable the resin mixture to be readily deposited onto the surface of the substrate 12 in liquid form or as a laminate to form the dielectric layer 26. Resins that could be used include thermoplastic resins, thermosetting resins, elastomers and mixtures thereof, which when incorporated with a photosensitive material yield a photoimageable composition. Desirable properties for the thick-film polymer include physical properties that remain stable throughout deposition and photoimaging of the dielectric layer 26. According to this invention, a portion of the dielectric layer 26 serves as a permanent insulator layer 36 between resistive films 34 and 38 of the multilayer resistor of FIG. 11, such that the dielectric properties of the thick-film polymer also preferably remain stable throughout the deposition and photoimaging processes.

For the above reasons, epoxies are particularly suitable as the resin for the dielectric layer 26, with a preferred positive-acting epoxy-base composition being PROBELEC®, which is commercially available from Ciba-Geigy. PROBELEC is a liquid resin, and therefore is preferably dried after its application. A suitable drying process is to heat the resin for about thirty minutes at about 100 C. Due to the presence of photosensitive agents, exposure of the dried PROBELEC dielectric layer 26 to appropriate electromagnetic radiation can be performed through a mask to precisely photochemically pattern the dielectric layer 26. Regions of the dielectric layer 26 exposed to electromagnetic radiation become relatively soluble to certain developers, while unexposed regions of the partially-cured dielectric layer 26 remain relatively insoluble.

FIG. 5 represents the result of laminating a second foil to the dielectric layer 26. This foil is preferably of the same type used to form the terminations 22A and 22B and the resistive layer 24 in FIG. 1, and therefore includes a resistive layer 28 and conductive layer 30. FIG. 6 shows the result of etching the conductive layer 30 to form a mask 32. According to this invention, the width of the mask 32 is critical, as it determines the linewidth of the resistive films 34 and 38 of FIG. 11. FIG. 7 shows the result of having removed that portion of the resistive layer 28 exposed by the mask 32, with the remaining resistive material defining a resistive film 38 precisely patterned by the mask 32. Suitable etchants for this step are those which can remove the exposed regions of the resistive layer 28 without severely attacking the mask 32. For a NiP resistive layer 28 and a copper mask 32, a preferred etchant is a solution containing about 250 grams of copper sulfate pentahydrate and about 2 milliliters of concentrated sulfuric acid per liter of solution.

Following the etching step of FIG. 7, that portion of the dielectric layer 26 left exposed by the mask 32 and resistive film 38 is removed, as shown in FIG. 8. Due to the presence of photosensitive agents, exposure of the dielectric layer 26 to appropriate electromagnetic radiation can be used to precisely photochemically pattern the dielectric layer 26.

Using a positive-acting photoimagable thick-film polymer such as PROBELEC, the exposed region of the dielectric layer 26 is electromagnetically irradiated in a known manner, with the mask 32 serving as a photomask to yield a relatively more soluble state in the exposed region of the dielectric layer 26. After partially curing, or "heat bumping," the dielectric layer 26, for example, at about 100 C to 120 C for about ten to sixty minutes, the exposed region of the dielectric layer 26 is removed by a suitable developer, e.g., gamma butylactone (GBL) if PROBELEC is used as the material for the dielectric layer 26. As a result of remaining unirradiated and therefore polymerized and relatively insoluble to the developer, that portion of the dielectric layer 26 beneath the mask 32 remains and is thereafter fully cured, e.g., held for about two hours at about 150 C if the dielectric layer 26 was formed of the PROBELEC resin. It is this remaining polymerized portion of the dielectric layer 26 that defines the insulator layer 36 between the resistive films 34 and 38 of FIG. 11. As is apparent from FIG. 8, the mask 32 also establishes the width and length of the insulator layer 36.

As shown in FIG. 9, the next step of the process is to remove that portion of the resistive layer 24 that was exposed by the removal of the unpolymerized portion of the dielectric layer 26. This step can be performed with the same etchant used to pattern the resistive layer 28. The portion of the resistive layer 24 remaining is the resistive film 34 of the resistor shown in FIG. 11. Thereafter, the mask 32 is then etched to form terminations 40A and 40B for the resistive film 38, as shown in FIG. 10. The termination 40A and 40B determine the electrical length of the resistive film 38, and are therefore carefully defined by patterning the mask 32 with an appropriate photomask. As with the etching step that produced the mask 32 in FIG. 6, a suitable photomask material is a conventional dry film photoresist, and a suitable etchant for defining the terminations 40A and 40B is a conventional alkaline ammoniacal etchant.

Figure 11:
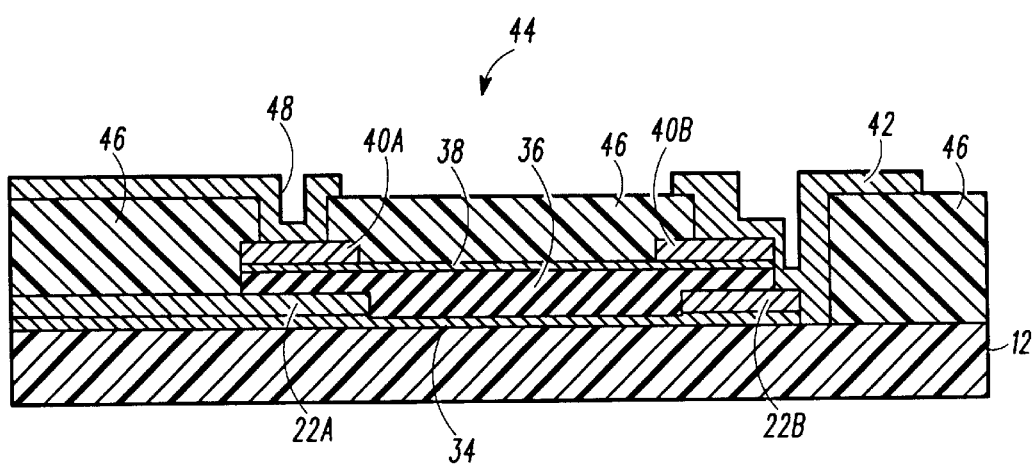
FIG. 11 is a cross-sectional view of the thin-film metal resistor of FIG. 1 showing the result of a final process step.

FIG. 11 shows the result of having coated the resistor structure formed by the process steps of FIGS. 3 through 10 with a layer of dielectric 46, and then forming a plated via 42 that electrically interconnects the terminations 22B and 40B, thereby completing the desired resistor loop between the terminations 22A and 40A to yield the two-layer resistor 44. It is foreseeable that essentially any conductive element could be used to electrically interconnect the terminations 22B and 40B. Separate plated vias (e.g., plated via 48 shown in FIG. 11) may also be formed to contact the terminations 22A and 40A if required. Conventional mulfilayer circuit board processes can be used to form the dielectric layer 46 and plated vias 42 and 48, and therefore this process will not be discussed in further detail.

While our invention has been described in terms of particular embodiments, it is apparent that other forms could be adopted by one skilled in the art. Furthermore, while the theory of the invention is believed to be that parasitic self-inductance generated by each film 14/16 is very nearly canceled by a negative mutual inductance generated by the other film 14/16 if the films 14 and 16 are accurately superimposed, the invention is not to be limited by any particular theory of operation. Accordingly, the scope of our invention is to be limited only by the following claims.

What is claimed is:

1. A method for manufacturing a printed circuit board having a two-layer thin-film metal resistor, the method comprising the steps of:

forming a first electrically-resistive film and a first electrically-conductive layer on a substrate so that the first electrically-conductive layer overlies the first electrically-resistive film;

etching the first electrically-conductive layer so as to define first and second metallic terminations on the first electrically-resistive film;

depositing a positive-acting photodielectric material on the first electrically-resistive film and the first and second metallic terminations;

forming a second electrically-resistive film and a second electrically-conductive layer on the positive-acting photodielectric material so that the second electrically-conductive layer overlies the second electrically-resistive film;

etching the second electrically-conductive layer so as to define a mask that exposes a first portion of the second electrically-resistive film and masks a second portion of the second electrically-resistive film;

using the mask to etch the second electrically-resistive film so as to remove the first portion of the second electrically-resistive film and expose a first portion of the positive-acting photodielectric material, the second portion of the second electrically-resistive film remaining between the mask and a second portion of the positive-acting photodielectric material;

using the mask to expose and develop the positive-acting photodielectric material so as to remove the first portion of the positive-acting photodielectric material and expose the first and second metallic terminations and a first portion of the first electrically-resistive film, the second portion of the positive-acting photodielectric material remaining between the mask and a second portion of the first electrically-resistive film so as to define a dielectric layer;

using the mask to etch the first electrically-resistive film so as to remove the first portion of the first electrically-resistive film and so that the second portion of the first electrically-resistive film remains between the mask and the substrate;

etching the mask so as to define third and fourth metallic terminations on the second electrically-conductive layer; and then forming a plated via so as to electrically interconnect the second and third metallic terminations and thereby define a resistor path that starts at the first metallic termination, follows the first electrically-resistive film to the second metallic termination, continues to the third metallic termination through the interconnecting means, and then follows the second electrically-resistive film to the fourth metallic termination.

2. The method according to claim 1, wherein the first and second electrically-resistive films are NiP films.

3. The method according to claim 1, wherein the first and second electrically-resistive films are formed to be rectangular in shape.

4. The method according to claim 1, wherein the first and second electrically-resistive films are formed to be serpentine in shape.

5. The method according to claim 1, wherein the second portions of the first and second electrically-resistive films have linewidths that are about five times greater than the thickness of the dielectric layer.

* * * * *